United States Patent [19]

Yamamoto

[11] Patent Number: 5,789,273
[45] Date of Patent: Aug. 4, 1998

[54] METHOD FOR FABRICATING COMPOUND SEMICONDUCTOR LASER

[75] Inventor: Tadashi Yamamoto, Kanagawa, Japan

[73] Assignee: Sony Corporation, Japan

[21] Appl. No.: 619,085

[22] Filed: Mar. 21, 1996

[30] Foreign Application Priority Data

Mar. 30, 1995 [JP] Japan ................. 7-073886

[51] Int. Cl.$^6$ ................................ H01L 21/00
[52] U.S. Cl. ................. 438/31; 438/46; 438/506; 438/681; 257/611; 148/DIG. 41; 148/DIG. 110
[58] Field of Search ................. 438/31, 681, 46, 433/506; 257/611; 148/DIG. 41, DIG. 110

[56] References Cited

U.S. PATENT DOCUMENTS

| | | | |
|---|---|---|---|
| 5,115,284 | 5/1992 | Kawasaki | 357/17 |
| 5,128,275 | 7/1992 | Takikawa et al. | 437/81 |
| 5,332,451 | 7/1994 | Hata et al. | 148/33.2 |
| 5,480,833 | 1/1996 | Kikkawa et al. | 437/126 |
| 5,548,136 | 8/1996 | Asai | 257/190 |
| 5,549,749 | 8/1996 | Asai | 117/90 |
| 5,569,953 | 10/1996 | Kikkawa et al. | 257/607 |

*Primary Examiner*—John Niebling
*Assistant Examiner*—Long Pham
*Attorney, Agent, or Firm*—Ronald P. Kananen

[57] ABSTRACT

After a compound semiconductor layer including InP is formed on a semiconductor substrate, a compound semiconductor layer including As is epitaxially grown by metal organic chemical vapor deposition method using an organic As as the material for feeding the As.

11 Claims, 2 Drawing Sheets

F I G. 2
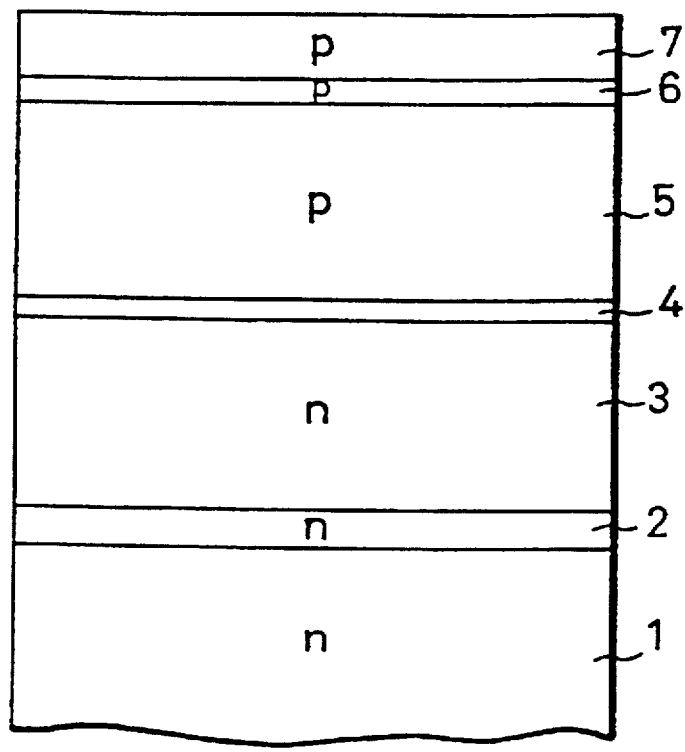

METHOD FOR FABRICATING COMPOUND SEMICONDUCTOR LASER

BACKGROUND OF THE INVENTION

The present invention generally relates to a method of fabricating a compound semiconductor laser and, more particularly, is directed to a method of fabricating a compound semiconductor laser suitable for obtaining a compound semiconductor laser including InP such as AlGaInP.

It has been known that when a compound semiconductor layer including InP is crystal-grown by a metal organic chemical vapor deposition (hereinafter simply rebened to as "MOCVD" method, hydrogen (H) is taken into the crystal of the compound semiconductor layer to thereby inactivate a dopant therein.

A problem similar to the aforesaid one is apprehended as to AlGaInP. Accordingly, with respect to the AlGaIn based visible light semiconductor laser, investigation has been made actively as to hydrogen taken into the AlGaInP based material. For example, such a report has been made that the hydrogen density and hence the carrier density within the AlGaInP differs depending on whether the conductivity type of a capping layer formed above a p-type AlGaInP cladding layer doped with Zn is n-type or p-type (see "A collection of Pre-lectures of The Japan Society of Applied Physics", Spring, 1992, Vol. 29 pZB-4). This difference of the carrier density is a difference of the hydrogen taken into the crystal. In this case, the lower the hydrogen is, the higher the carrier density becomes. In other words, Zn serving as the dopant is inactivated by the hydrogen taken into the crystal.

FIG. 1 is a schematic sectional view showing an AlGaInP based III-V group visible light semiconductor laser which is formed by a conventional method for fabricating a compound semiconductor laser. As shown in FIG. 1, the AlGaInP based III-V group visible light semiconductor laser is fabricated in the following manner. Firstly, on an n-type GaAs substrate 1, for example, a buffer layer 2 made of an n-type GaAs is epitaxially grown, and then a first cladding layer 3 made of an n-type AlGaInP, an active layer 4 made of a non-doped GaInP, a second cladding layer 5 made of a p-type AlGaInP, an intermediate layer 6 made of a p-type GaInP, and a capping layer 7 made of a p-type GaAs are sequentially epitaxially deposited by MOCVD.

The epitaxial growth of the respective layers 2 to 7 by MOCVD is performed in the following manner. That is, TMGa (trimethylgallium) or TEGa (triethylgallium) is used as the material for feeding III-group Ga, TMAl (trimethylaluminum) or TEAl (triethylaluminum) is used as the material for feeding Al, TMIn (trimethylindium) or TEIn (triethylindium) is used as the material for feeding In, $AsH_3$ is used as the material for feeding V-group As, and PH3 is used as the material for feeding P. Further, $H_2Se$ is used as the material for feeding an n-type impurity Se serving as a dopant, and $SiH_4$ or $Si_2H_6$ is used as the material for feeding Si. DMZn (dimethylzinc) or DEZn (diethylzinc) is used as the material for feeding a p-type impurity Zn.

In the case of fabricating the AlGaInP based visible light semiconductor laser, a problem always arises in the p-type AlGaInP cladding layer from a stand point of characteristic and reliability of the laser, that is, the life time thereof. This is because, in the p-type AlGaInP cladding layer, the activation rate of the Zn serving as the p-type dopant is low, so that the carrier density is almost $7 \times 10^{17}$ $cm^{-3}$ at most and hence the resistance value becomes high, and hence heat value generated upon operation of the laser becomes large to thereby shorten the life time of the laser i.e. degrade the reliability thereof.

Another report has been made that, recently, it has been clarified gradually that, in the p-type AlGaInP, the Zn is inactivated by hydrogen taken into the p-type AlGaInP, and the hydrogen in the crystal can be decreased by heat process thereof to thereby increase the activation rate of Zn. In other words, the carrier density in the p-type AlGaInP is increased by the heat process (see "ELECTRONICS LETTERS" 12th, Mar. 1992, Vol. 28, No. 6, pp. 585 to 587). Such a phenomenon has been also affirmed by the inventors etc. of the present invention. However, such a heat process causes the movement of impurity in the vicinity of the active layer, thereby degrading the reliability of the laser.

As described above, in the AlGaInP based semiconductor laser, the Zn serving as the dopant is inactivated by the hydrogen taken into the p-type AlGaInP crystal, and hence the characteristic of the laser is degraded due to the inactivation of Zn. In view of this fact, it will be understood that, when hydrogen is prevented from being taken into the p-type AlGaInP crystal, the activation rate of Zn would be made higher to thereby constitute the semiconductor laser with high quality.

As to the question in which process hydrogen is taken into the p-type AlGaInP crystal, a still another report has been made that hydrogen contained in $AsH_3$ used as the material for feeding the As would be taken into the p-type AlGaInP crystal in the epitaxial growing process of the GaAs capping layer or a temperature-decreasing process after the epitaxial growth thereof. It has been said that such a phenomenon would appear also in the InP based semiconductor layer.

Further, it has been said that the rate of the hydrogen taken from $AsH_3$ into the AlGaInP crystal is higher than that of the hydrogen taken from $PH_3$ into the AlGaInP crystal. In fact, a still another report has been made that, at the time of decreasing temperature after the epitaxial growth of the p-type GaAs capping layer, when the supply of the $ASH_3$ used as the material of the As is stopped and only $H_2$ gas is supplied, the carrier density in the P-type AlGaInP is increased (see S. Minagawa et al., "Journal of Crystal Growth" 118, 1992, p.425).

SUMMARY OF THE INVENTION

An object of the present invention is to provide a method of fabricating a compound semiconductor laser including InP which is able to make the carrier density sufficiently high to thereby provide the laser with high reliability, longer life time and excellent laser characteristics.

As an aspect of the present invention, there is provided a method of fabricating a compound semiconductor laser which includes the steps of fabricating a compound semiconductor layer including InP on a semiconductor substrate, and then epitaxially growing a compound semiconductor layer including As by a metal organic chemical vapor deposition method using an organic As as material for feeding As.

According to the method of fabricating the compound semiconductor laser of the present invention, the organic As is used as the material for feeding As instead of using $AsH_3$ like the conventional method. In other words, an organic As or a material that the organic group exists around As, that is, H does not exist or quite few H exist around As is used as the material for feeding As. Accordingly, hydrogen is prevented from being taken into the InP based semiconductor layer, and hence the semiconductor layer with a high carrier density can be fabricated.

BRIEF DESCRIPTION OF THE DRAWINGS

FIG. 2 is a schematic sectional view showing an AlGaInP based III-V visible light semiconductor laser formed by a method for fabricating a compound semiconductor laser according to an embodiment of the present invention.

DESCRIPTION OF THE PREFERRED EMBODIMENT

Figure 1:
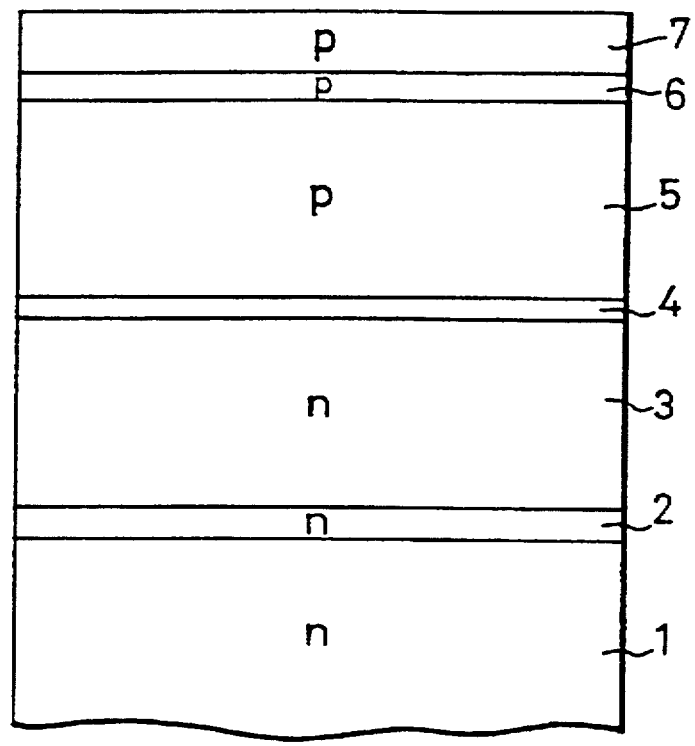
FIG. 1 is a schematic sectional view showing an AlGaInP based III-V group visible light semiconductor laser formed by a conventional method for fabricating a compound semiconductor laser.

A method of fabricating a compound semiconductor laser according to an embodiment of the present invention will be described with reference to FIG. 2. In this embodiment, while the present invention is applied to a case of fabricating a double-heterojunction semiconductor laser on a GaAs substrate 1, the present invention is not limited thereto and may be applied to various types of semiconductor lasers.

As shown in FIG. 2, the semiconductor laser according to the embodiment is fabricated in the similar manner as the conventional fabricating method described above. That is, firstly, on an n-type GaAs substrate 1, for example, a buffer layer 2 made of an n-type GaAs is epitaxially grown, and then a first cladding layer 3 made of an n-type AlGaInP, an active layer 4 made of a non-doped GaInP, a second cladding layer 5 made of a p-type AlGaInP, an intermediate layer 6 made of a p-type GaInP and a capping layer 17 made of a p-type GaAs are sequentially epitaxially deposited by MOCVD to thereby fabricate the semiconductor laser.

The epitaxial growth of the respective layers 2 to 17 by MOCVD is performed in the following manner. That is, TMGa (trimethylgallium) or TEGa (triethylgallium) is used as the material for feeding the III-group Ga, TMAl (trimethylaluminum) or TEAl (triethylaluminum) is used as the material for feeding the Al, TMIn (trimethylindium) or TEIn (triethylindium) is used as material for feeding the In, and $PH_3$ is used as the material for feeding the V-group P. Further, $H_2Se$ is used as the material for feeding a n-type impurity Se serving as a dopant, and $SiH_4$ or $Si_2H_6$ is used as the material for feeding the Si. DMZn (dimethylzinc) or DEZn (diethylzinc) is used as the material for feeding a p-type impurity Zn.

In the present invention, especially, the GaAs buffer layer 2, i.e., the semiconductor layer including As, formed before the fabrication of the compound semiconductor layer including InP or the second cladding layer 5 made of the p-type AlGaInP in this embodiment, is formed by using $ASH_3$ serving as the material for feeding the As like the conventional fabrication method. However, in the process of fabricating the semiconductor layer including As after the fabrication of the compound semiconductor layer including InP or the second cladding layer 5 made of the p-type AlGaInP, that is, in the process of fabricating the aforesaid semiconductor laser, an organic As is particularly used as the material for feeding the As in the case of forming the capping layer 17 by MOCVD.

TMAs (trimethylarsenic) or TEAs (triethylarsenic) is most preferable as the organic As. In addition thereto, for example, TBAs (tertiarybutylarsenic), DEAsH (diethylarsenic) or $EAsH_2$ (ethylarsenic) or the like can be used as the organic As. Unlike the $AsH_3$ in which hydrogens exist around the As, the organic As is formed in a manner that the organic group exists around the As, that is, H does not exist or quite few H exist around As. Accordingly, hydrogen can be prevented from being taken into the InP based compound semiconductor layer such as the cladding layer 5 made of the AlGaInP and the intermediate layer 6 made of the GaInP. Otherwise, the rate of hydrogen taken into the InP based compound semiconductor layers can be quite reduced.

Accordingly, the compound semiconductor laser including the InP can be fabricated, by the sequential epitaxial growing process or one sequential epitaxial growth without performing special epitaxial growing process or procedure, in which hydrogen can not be taken into the compound semiconductor layer including InP such as the p-type AlGaInP semiconductor layer.

After the epitaxial growth of the respective layers 2 to 7, the temperature of the semiconductor laser is decreased from the substrate temperature upon the MOCVD process. In this case, the present invention does not require such a conventional procedure using the $AsH_3$ that the supply of $AsH_3$ is stopped and only $H_2$ gas is supplied to thereby hold the atmosphere of only $H_2$ gas. In other words, according to the method of the present invention, the temperature-decreasing process after the epitaxial growth is performed not in the atmosphere of only the $H_2$ gas but in the atmosphere of the pressured As gas, so that the surface roughness caused by the atmosphere of only the $H_2$ gas can be prevented.

In the aforesaid fabricating method according to the present invention, although $PH_3$ is used in the epitaxial growth process using the MOCVD method so as to fabricate the cladding layer 5 made of the AlGaInP, the hydrogen of $PH_3$ is hardly taken into the epitaxially grown semiconductor layer.

Although not shown in FIG. 2, one electrode is deposited on the rear surface of the substrate 1 in an ohmic contact therewith, and an insulating layer (not shown) is deposited on the capping layer 17. In this case, an electrode contact window of a stripe-like configuration is formed, for example, through the center portion of the insulating layer, so that the other electrode is made in an ohmic contact with the capping layer 17 through the stripe-shaped electrode contact window.

According to the method of the present invention, at the time of fabricating the semiconductor layer including the As, that is, the aforesaid semiconductor laser fabricated after the fabrication of the second cladding layer 5 made of the p-type AlGaInP, the capping layer 17 is formed by the MOCVD method which uses the organic As as the material for feeding the As instead of using $AsH_3$ which makes larger the rate of hydrogen taken into the InP based compound semiconductor layer. As a consequence, hydrogen can be prevented from being taken into the cladding layer 5 or the rate of hydrogen taken into the cladding layer 5 can be remarkably decreased during the epitaxial grow process of the capping layer 17. Further, hydrogen can be prevented from being taken into the semiconductor layer even in the temperature-decreasing process since no $AsH_3$ is not used as the material for feeding the As.

While, in the aforesaid embodiment, the explanation has been made as to the AlGaInP based semiconductor laser having the cladding layer made of the AlGaInP based compound semiconductor, the present invention is not limited thereto and may be applied to a compound semiconductor laser including the InP such as a semiconductor laser made of a GaInAsP based compound semiconductor or the like.

While, in the aforesaid embodiment, the explanation has been made as to the double-heterojunction semiconductor laser shown in FIG. 2, the present invention is not limited thereto and may be applied to the case of fabricating various types of semiconductor lasers such as separate confinement heterostructure type or the like.

According to the method for fabricating the compound semiconductor laser of the present invention, the organic As is used as the material for feeding the As instead of using the AsH$_3$ like the conventional method. In other words, according to the present invention, such material is used as the material for feeding the As that the organic group exists around the As, that is, H does not exist or quite few H exist around the As. Accordingly, hydrogen is prevented from being taken into the InP based semiconductor layer, and hence hydrogen is effectively prevented from being taken into the semiconductor layer with a high carrier density such as the AlGaInP based cladding layer, GaInAsP based cladding layer, GaInP based intermediate layer or the like. As a consequence, the impurity Zn contained in the cladding layers and the intermediate layer can be prevented from being inactivated by the hydrogen, so that the crystal quality or the crystarability is improved due to the increase of the activation rate and hence the reliability of the laser as well as the static characteristic thereof can be improved.

Further, since the entire resistance value of the laser element is reduced by reducing the resistance values of the p-type cladding layer and the intermediate layer, the driving voltage of the laser and the heat value upon operation of the laser can be decreased, so that the reliability of the laser can be improved and the life time thereof can be improved. Furthermore, since the Fermi level of the p-type cladding layer is lowered to thereby make the band gap difference between the p-type cladding layer and the active layer larger, the overflow of the carrier can be suppressed and the characteristic temperature $T_0$ be improved.

Having described a preferred embodiment of the invention with reference to the accompanying drawing, it is to be understood that the invention is not limited to that precise embodiment and that various changes and modifications thereof could be effected therein by one skilled in the art without departing from the spirit or scope of the invention as defined in the appended claims.

What is claimed is:

1. A method for fabricating a compound semiconductor laser, comprising the steps of:

fabricating a compound semiconductor layer including InP on a semiconductor substrate; and epitaxially growing a compound semiconductor capping layer including As by metal organic chemical vapor deposition with an organic As as material for feeding the As.

2. A method for fabricating a compound semiconductor laser according to claim 1, wherein said compound semiconductor layer including InP is a semiconductor layer made of AlGaInP.

3. A method for fabricating a compound semiconductor laser according to claim 1, wherein said organic As is a by trimethylarsenic (TMAs).

4. A method for fabricating a compound semiconductor laser according to claim 1, wherein said organic As is a triethylarsenic (TEAs).

5. A method for fabricating a compound semiconductor laser according to claim 1, wherein said compound semiconductor layer including InP is a semiconductor cladding layer.

6. A method for fabricating a compound semiconductor laser, comprising the steps of:

fabricating a compound semiconductor layer including InP on a semiconductor substrate; and epitaxially growing a compound semiconductor layer including As by metal organic chemical vapor deposition with the compounds: $R_3As$, or $R_2AsH$ as material for feeding the As, wherein R is either methyl or ethyl.

7. A method for fabricating a compound semiconductor laser according to claim 6, wherein said compound semiconductor layer including InP is a semiconductor layer made of AlGaInP.

8. A method for fabricating a compound semiconductor laser, comprising the steps of:

fabricating a compound semiconductor layer including InP on a semiconductor substrate; and epitaxially growing a compound semiconductor GaAs layer by metal organic chemical vapor deposition with an organic As compound feeding the As.

9. A method for fabricating a compound semiconductor laser according to claim 8, wherein said compound semiconductor layer including InP is a semiconductor layer made of AlGaInP.

10. A method for fabricating a compound semiconductor laser according to claim 8, wherein said organic As is at least one of the compounds: $R_3As$, or $R_2AsH$, wherein R is either methyl or ethyl.

11. A method for fabricating a compound semiconductor laser according to claim 8, wherein said compound semiconductor layer including InP is a semiconductor cladding layer.

* * * * *